United States Patent [11] 3,631,528

[72] Inventor Robert S. Green
345 E. Brahma, Murray, Utah 84107
[21] Appl. No. 63,727
[22] Filed Aug. 14, 1970
[45] Patented Dec. 28, 1971

[54] LOW POWER CONSUMPTION COMPLEMENTARY DRIVER AND COMPLEMENTARY BIPOLAR BUFFER CIRCUITS
12 Claims, 9 Drawing Figs.

[52] U.S. Cl. ........ 307/251, 307/237, 307/279, 307/288, 307/303, 307/304, 307/313
[51] Int. Cl. ........ H03k 17/60
[50] Field of Search ........ 307/205, 237, 238, 251, 279, 288, 303, 304, 313

[56] References Cited
UNITED STATES PATENTS

| | | | |
|---|---|---|---|
| 3,260,863 | 7/1966 | Burns et al. .......... | 307/205 |
| 3,539,839 | 11/1970 | Igarashi .......... | 307/303 |

*Primary Examiner*—Stanley T. Krawczewicz
*Attorney*—James and Fanklin

ABSTRACT: A low-power complementary driver comprising a first complementary inverter is provided with a special circuit for turning the N-channel device off before the P-channel device is turned on and vice versa to greatly reduce power consumption. This is accomplished by two additional complementary inverters having different transition voltages connected between the input signal and the gates of the N and P-channel devices, respectively, of the first complementary inverter. A complementary-bipolar inverter is provided using the same technique with one of said additional inverters being replaced by a double inverter.

INVENTOR
ROBERT S. GREEN
BY James and Franklin
ATTORNEY

INVENTOR
ROBERT S. GREEN
BY James and Franklin
ATTORNEY

INVENTOR
ROBERT S. GREEN
BY James and Franklin
ATTORNEY

INVENTOR
ROBERT S. GREEN
BY James and Franklin
ATTORNEY

LOW POWER CONSUMPTION COMPLEMENTARY DRIVER AND COMPLEMENTARY BIPOLAR BUFFER CIRCUITS

This invention relates to transistor circuits and more particularly to MOS and MOS-bipolar complementary circuits.

The metal-oxide semiconductor (MOS) field effect transistor (FET) is a voltage controlled device which exhibits an extremely high input resistance, allowing direct coupling in digital circuits. MOSFETS may be P-channel or N-channel. In a typical P-channel device, two highly doped P-type areas defining the source and the drain are diffused into an N-type silicon substrate. (In practice they are separated by about 0.2 mils for a driver device.) A thin insulating material, commonly silicon dioxide, is grown or deposited on the silicon substrate between the source and the drain over which a metal electrode is deposited to form the insulated gate electrode. If the gate is zero potential with respect to the source, no current flows from source to drain because the PN-junctions are reverse biased. As the gate is made negative, positively charged holes are induced into a thin channel region in the silicon substrate adjacent the oxide interface. When enough holes are induced in the channel to overcompensate for the N-type doping, the channel changes from N-type to P-type and is said to be inverted; ohmic conduction then occurs between source and drain. The gate voltage at which conduction begins is known as the threshold voltage, $V_T$. As the gate is made more negative the inversion layer is driven deeper and conduction continues to increase, approaching a steady state "on" or saturation value. An N-channel device operates on the same principles with the polarities reversed—that is, the channel is inverted from P-type to N-type and the device is normally on (conductive) at zero gate bias as opposed to the P-channel device which is normally off (nonconductive) at zero gate bias.

Since it is desirable to use an initially off device for switching in digital circuits, commercial MOS single polarity integrated circuits (which operate on negative supply voltages) commonly utilize the P-channel device. In the common mode of operation of such devices, the source is usually connected to the substrate and grounded and the drain is connected to a negative potential via a load resistor. The operative node capacitances at the junction between the output circuits of the switching device and the load resistor are charged through the resistor or discharged through the switching device, depending upon the control signal at the gate terminal of the switching device.

Single polarity MOSFET circuits of this type have a number of disadvantages. It will be apparent that if the device is turned on by the control signal, current and power is drawn continuously to discharge the node capacitance. Another disadvantage of this structure is that because the gate of the load resistor is tied to its drain, there is always an offset voltage equal to $V_T$ across the load resistor. This can be avoided by providing a separate supply to the gate. However, the provision for a separate supply voltage is cumbersome and generally undesirable.

Complementary MOS technology has long been regarded as the ideal solution to many of these difficulties. In effect, a complementary MOS structure replaces the load resistor with an N-channel device. With this arrangement a positive supply voltage is used and the N-channel device is normally off at zero (ground) gate bias while the P-channel device is normally on when its gate is at 0 volts. The node capacitances are thus charged or discharged only during switching. As a result, a complementary gate draws approximately zero power while in the quiescent state and circuit voltages swing the full supply voltage, making two supplies unnecessary. During switching enough current must be supplied to charge the stray capacitance associated with each node that changes state. Since this is done through the saturation resistance of an active device instead of through a load resistor, the charging time is very short and operating frequency very high. Complementary structures are therefore extremely useful for low-power high-speed applications, such as large computer memories.

While complementary circuits have extremely low standby (DC) power characteristics, they do consume considerable power during switching since both N- and P-type devices are conducting current during this period. It has been found that the major portion of this current does not go to charging the load capacitor but instead effectively shorts out the power supply. As a result, the power consumed during switching is largely dissipated and the capacitive driving capability and switching speeds of such circuits are limited.

It is a primary object of the present invention to design a complementary MOS driver circuit with significantly reduced power consumption during switching.

It is a further object of the present invention to provide a complementary MOS circuit which is adapted to drive a large capacitive load at a high speed and still dissipate a small amount of power.

It is yet another object of the present invention to provide a complementary MOS-bipolar inverter circuit in which substantially all the current is used to charge the load capacitor.

It is still another object of the present invention to provide circuits of the type described in which the output rise and fall time is reduced and power dissipation is minimized at all frequencies.

To these ends there is provided a complementary MOS driver circuit having three inverter stages. Two of these stages comprise small complementary MOS devices and are both adapted to invert the input signal with a slight time delay between their outputs. The inverted output which is first in time is applied to the initially on device and the subsequent inverted signal is applied to the initially off device of the third inverter stage so that the initially on device is rendered fully nonconductive prior to the initiation of conduction through the initially off device.

The same technique can be used when a bipolar output is used in place of the P-channel device by using a double inverter to drive the N-channel device.

To the accomplishment of the above, and to such other objects as may hereinafter appear, the present invention relates to MOS and MOS-bipolar complementary circuits, as defined in the appended claims and as described in this specification, taken together with the accompanying drawings, in which:

Figure 1:
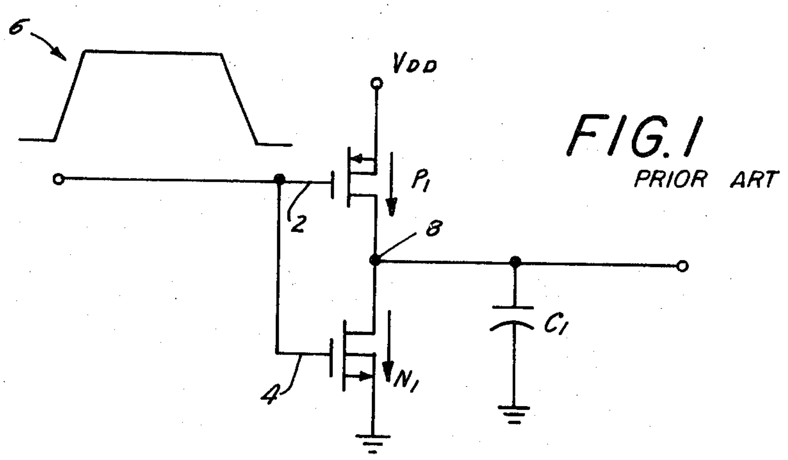
FIG. 1 PRIOR ART
FIG. 1 is a circuit diagram schematically illustrating a typical prior art complementary MOS inverter circuit and showing a typical pulse-type input signal.

A typical prior art complementary inverter circuit is illustrated in FIG. 1. P- and N-channel field effect devices designated P1 and N1 respectively (both of the enhancement type) are connected in series between a positive supply $V_{DD}$ and ground. An input signal in the form of a positive going pulse generally designated 6 is applied to the gate terminals 2 and 4 of FETs P1 and N1, respectively, the output being defined at the junction 8 between the output circuits of the two devices. Load capacitor C1 represents the capacitive load driven by the circuit and may comprise the stray or interelectrode capacitances of the devices driven or a combination of such stray capacitance and discrete capacitors. In the present illustration C1 represents approximately 8 pf. In operation when the input is low (at ground or 0 volts), the N-channel device N1 is rendered nonconductive (off) as its gate is returned to its source voltage (ground). The P-channel device P1, however, has its gate at the most negative potential in the circuit and is thus rendered conductive (on). Under these conditions the output at 8 goes high (positive) and is inverted relative to the low-input signal, C1 being charged positive. When the input goes high, FET N1 is turned on and FET P1 is turned off, resulting in a low (ground) output. It should be noted that in either quiescent state, one device is on (presenting a low driving impedance to C1) and the other device is off (limiting the current drain, and thus power, to the leakage value). However, as previously noted, because the output current characteristics of MOS devices during switching are gradual, both devices are conducting during a portion of the time that switching is taking place.

Figure 5:
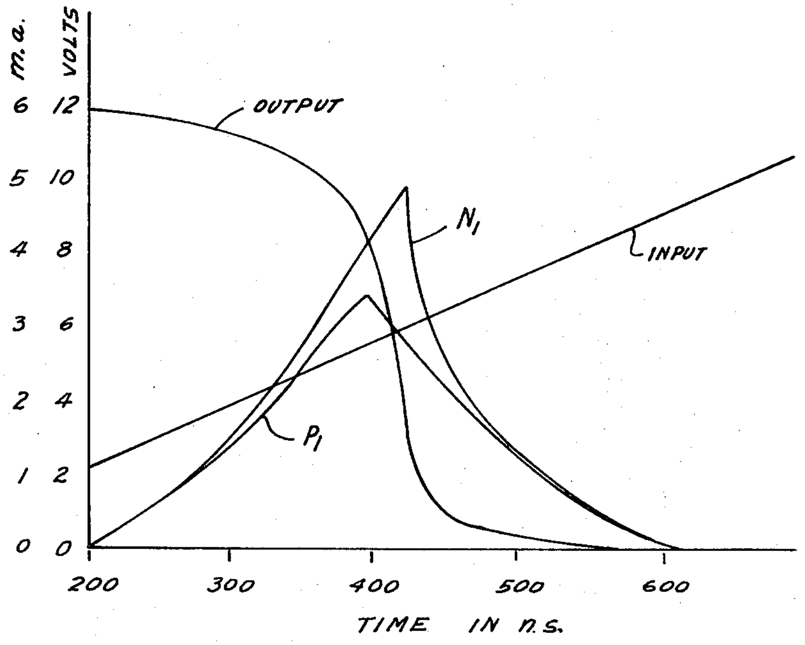
FIGS. 5 and 6 are graphical illustrations of the input and output signal and the current through both the P- and N-channel devices of the circuit of FIG. 1 versus time for the positive and negative going edges, respectively, of the input pulse shown in FIG. 1.
Figure 6:
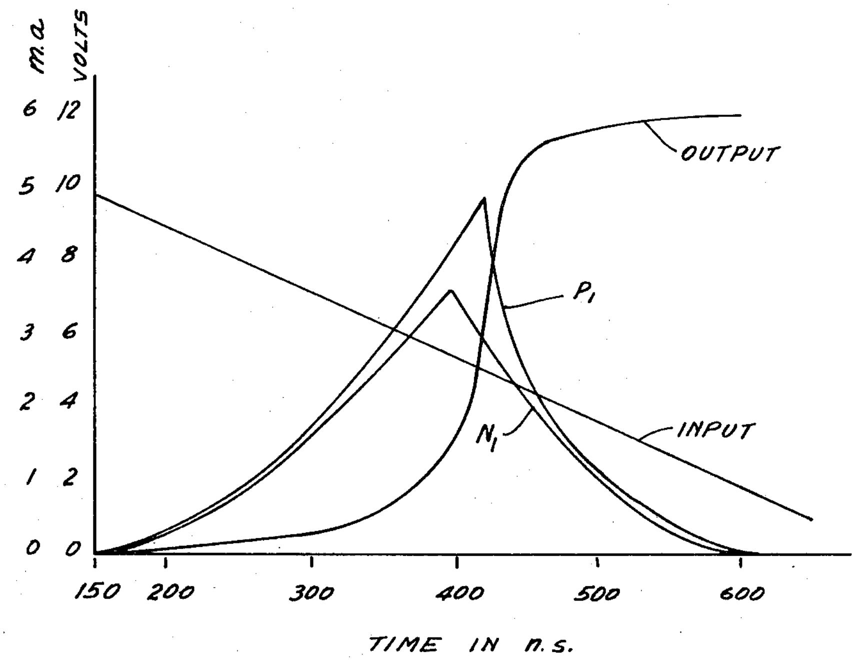

FIGS. 5 and 6 show the current characteristics of P1 and N1 (in milliamperes) superimposed on the input and output signals (in volts) during switching. For purposes of illustration the $V_{DD}$ supply and the input pulse amplitude will be assumed to be +12 volts. It should be noted, however, that the pulse level need not be equal to $V_{DD}$. The only requirement is that both the input pulse level and the $V_{DD}$ supply (output pulse level) be sufficiently positive to produce effective switching. It will be recalled that MOSFET conduction begins when the gate bias reaches the threshold voltage of the device $V_T$. Thus, as shown in FIG. 5, current begins to flow through N1, as the input rises to $V_T$ (which in the present case is approximately 2.5 volts). Since FET P1 is still fully "on" at this point (its gate bias being 12–2.5 or 9.5 volts) current also begins to flow through FET P1. The current in both devices rises as FET N1 becomes more conductive. When the input reaches approximately 5 volts, P1 begins to turn off and current in both devices begins to drop off reaching zero when the input reaches approximately 9.5 volts (within 2.5 volts or $V_T$ of $V_{DD}$). The magnitudes of the peak currents are proportional to the P1 and N1 device widths. The difference between the currents through P1 and N1 is the current discharging the load capacitor to 0 volts (as represented by the output voltage curve), and is proportional to the load capacitance (8 pf. for the present case).

As illustrated in FIG. 6, the reverse process occurs at the negative going edge of the input pulse. It will be noted that in this case the current through P1 exceeds the current through N1 by an amount necessary to charge C1 to the $V_{DD}$ supply level. In both cases it will be noted that N1 and P1 are conducting while the input is between $V_{DD}-|V_{TP}|$ and $V_{TN}$ (about 400 ns.), where $V_{TP}$ and $V_{TN}$ represent the threshold voltages (in this case −2.5 and +2.5 volts) of P1 and N1 respectively. Thus it can be seen that current and power consumption is a function of the input rise and fall time, which in most cases it is not possible to reduce. It will be apparent, however, that if the P-channel device can be turned fully off before the N-channel device is turned fully on (for the positive going edge of input pulse 6) and vice versa (for the negative going edge of the input pulse 6), current and power consumption can be significantly reduced.

Figure 2:
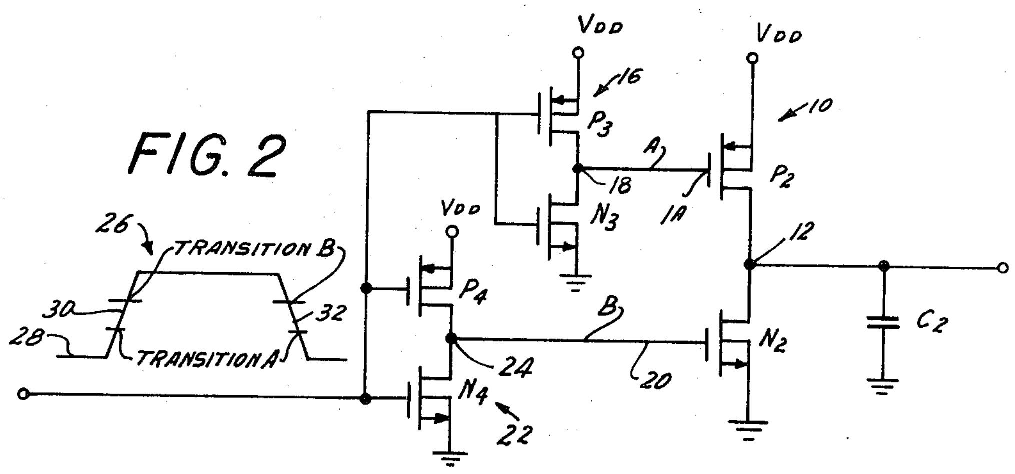
FIG. 2 is a circuit diagram schematically illustrating the complementary MOS driver circuit of the present invention and showing a typical pulse-type input signal.

The circuit of FIG. 2 is adapted to accomplish this result. As there shown a complementary inverter generally designated 10 comprises N- and P-channel devices N2 and P2 respectively connected in series between the $V_{DD}$ supply and ground. Inverter 10 is adapted to drive a large capacitive load C2 at its output node 12 at the junction of the output circuits of FETs P2 and N2. The gate terminal 14 of FET P2 is driven by the output A of a second complementary inverter stage generally designated 16 comprising complementary FETs P3 and N3 connected in series between the $V_{DD}$ supply and ground and having an output node 18 at the junction of their output circuits. Similarly the gate 20 of FET N2 is driven by the output B of a third inverter stage 22 comprising FETs P4 and N4 connected in series between $V_{DD}$ and ground and having an output node 24 at the junction of their output circuits. The gates of P3, N3, P4 and N4 are all driven by the input signal shown in the form of a positive pulse 26 (having an amplitude of $V_{DD}$). When the input is low (0 volts) as at 28 the outputs of inverter stages 16 and 22 are both high (at the $V_{DD}$ level) and thus FET N2 is on and FET P2 is off, making the output at 12 low. In order to turn N2 off before P2 turns on as the input goes high along the positive going edge 30 and vice versa along the negative going edge 32, the output A from inverter 16 must be slow going negative and the output B from inverter 24 must be slow going positive, i.e., the transition voltage of inverter 16 must be less than that of inverter 22. The transition voltage of a complementary inverter is defined as the point at which the input and output voltages are equal and can be calculated by the equation:

$$V_{TR}=\frac{\sqrt{\frac{KP}{KN}}[V_{DD}-V_{TP}]+V_{TN}}{1+\sqrt{\frac{KP}{KN}}}$$

where $K$ is a function of the channel width to length ratio W/L of the device, the subscripts representing the P and N devices, respectively.

Figure 7:
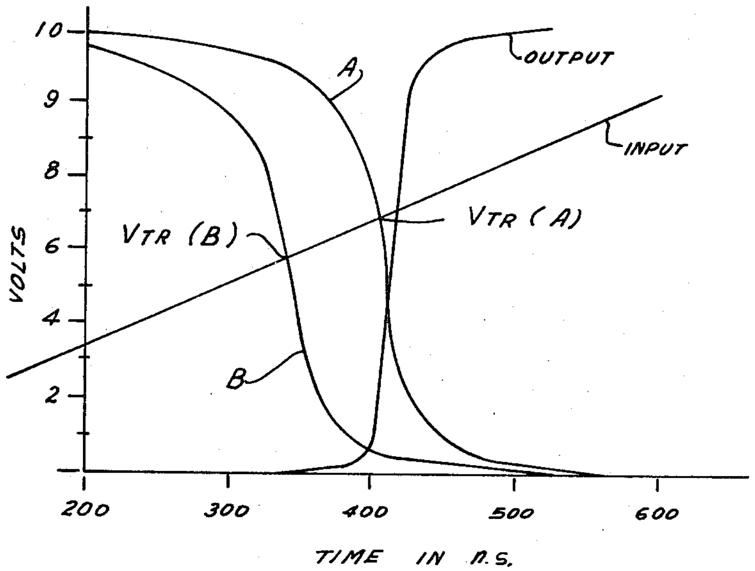
FIGS. 7 and 8 are graphical illustrations of the output signals from the three inverter stages of the circuit of FIG. 2 versus time for the positive and negative going edges, respectively, of the input pulse shown in FIG. 2.

By making the ratio of the channel widths of the P3 and N3 devices relatively high and the ratio of the widths of the P4 and N4 devices relatively low, the transition voltage of inverter 16 may be made lower than that of inverter 24. This is illustrated graphically in FIGS. 7 and 8. As shown in FIG. 7, as the input rises output B begins to fall first, having a transition voltage $V_{TR}$(B) of approximately 5.5 volts. Output A, however, does not begin to fall steeply until output B has almost reached 0 volts, the transition of A occurring at approximately 7 volts. It will be apparent from FIG. 7 that output A does not drop to a level sufficient to begin turning on FET P2 (9.5 volts) until the level of output B has reached a level sufficient to fully turn off FET N2 (2.5 volts).

Figure 8:
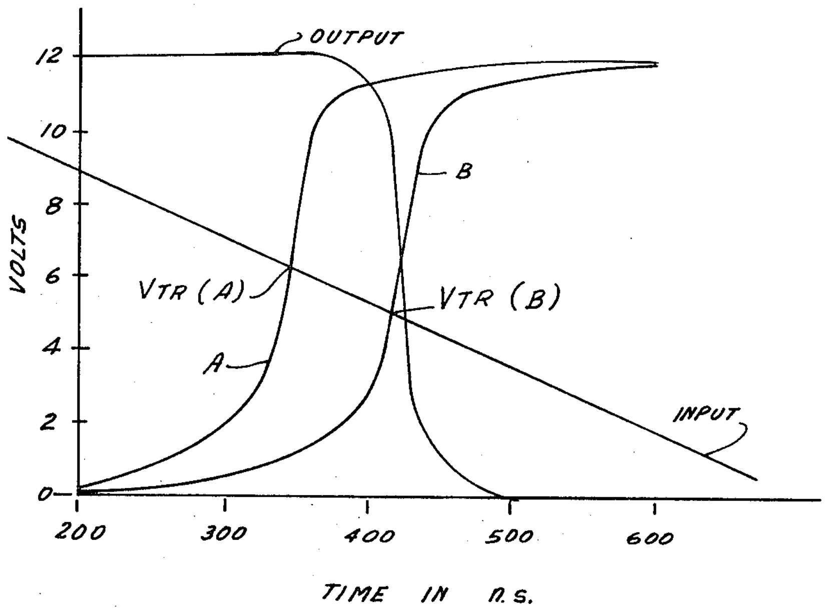

As illustrated in FIG. 8, the situation is just the reverse at the negative going edge of the input pulse. Thus, output B does not reach the turn-on level of N2 (2.5 volts) until output A has reached the level sufficient to turn FET P2 fully off (9.5 volts). It will thus be apparent that current never flows through devices P2 and N2 simultaneously so that the power supply is never shorted through inverter 10 and only the small amount of current necessary to charge and discharge load capacitor C1 flows through P2 and N2, respectively, during switching. As a result the rise and fall time of the output signal is considerably reduced from about 400 ns. (FIGS. 5 and 6) to about 50 ns. (FIGS. 7 and 8) and power consumption is kept to a minimum. Moreover, because current and power consumption is limited to that necessary to charge the load capacitor, the P2 and N2 devices may be designed with an "on" resistance low enough to drive a capacitive load of up to 200 pf. without a large power consumption. While power is of course dissipated by the concurrent conduction of the P and N devices in inverter stages 16 and 24, this power consumption can generally be kept relatively low by reducing the size of these devices since these stages need only drive the gates 14 and 20 of FETs P2 and N2, respectively.

Figure 3:
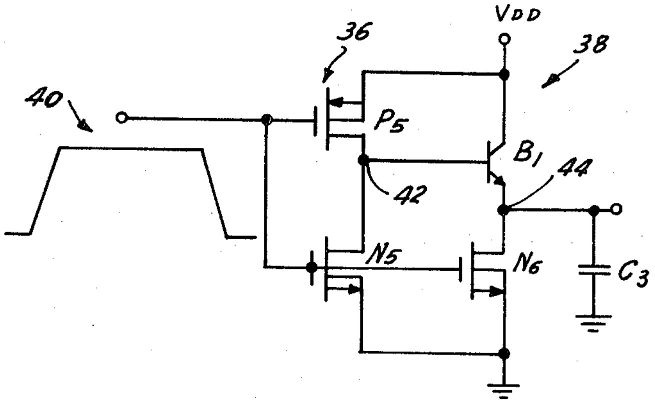
FIG. 3 PRIOR ART
FIG. 3 is a circuit diagram schematically illustrating a prior art complementary MOS-bipolar inverter circuit and showing a typical pulse-type input signal.

The foregoing technique may also be adapted to circuits having a complementary MOS-bipolar output. FIG. 3 shows a typical prior art complementary MOS-bipolar inverter circuit, having a first inverter stage 36 comprising complementary FETs P5 and N5 having their output circuits connected in series between a positive voltage supply $V_{DD}$ and ground. A second inverter stage 38 comprises an NPN-bipolar transistor B1 having its collector connected to the $V_{DD}$ supply and its emitter connected to the source of an N-channel FET N6 having its drain connected to ground. The gate terminals of FETs P5, N5 and N6 all receive the input signal shown in the form of a positive pulse 40 (of amplitude $V_{DD}$). The base of transistor B1 receives the output of inverter 36 at the junction 42 of the output circuits of FETs P5 and N5. The output of circuit 38 at the junction 44 of the emitter of B1 and the source of N6 drives a capacitive load C3.

It will be apparent that when the input is low P5 is on, N5 and N6 are off and the output of inverter 36 at node 42 is high. Accordingly, B1 is on and capacitor C3 is charged to the $V_{DD}$ supply level. As the input 40 goes high P5 is turned off, N5 and N6 are turned on and the output of inverter 36 at node 42 goes low. Thus B1 is turned off and capacitor C3 is discharged to ground via FET N6. The NPN-bipolar transistor is desirable since it reduces the capacitance seen at node 42 and thus increases switching speed. However, here again considerable power is consumed as both B1 and N6 are conducting for some appreciable time during switching.

Figure 4:
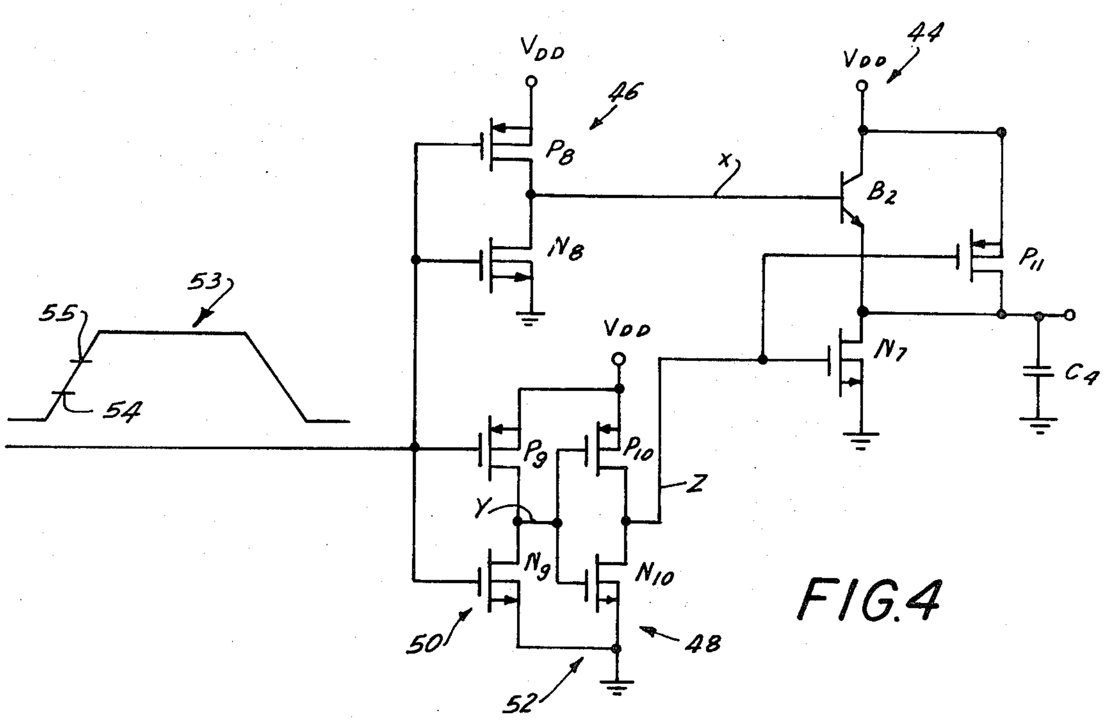
FIG. 4 is a circuit diagram schematically illustrating the complementary MOS-bipolar inverter circuit of the present invention, and showing a typical pulse-type input signal.

FIG. 4 illustrates a complementary MOS-bipolar inverter utilizing the same technique as that used in the driver circuit of FIG. 2. As there shown, the circuit comprises a complementary bipolar circuit 44, a complementary MOS inverter stage 46 and a double inverter stage 48 comprising two MOS complementary inverters 50 and 52 in cascade. Complementary bipolar circuit 44 comprises an NPN-bipolar transistor B2 having its collector connected to the $V_{DD}$ supply and its emitter connected to the source of an N-channel FET N7 having its drain terminal connected to ground. Inverter stages 46, 50 and 52 comprise complementary devices P8, N8, P9, N9, P10, and N10, respectively, connected in the usual manner in series between the $V_{DD}$ supply and ground. The gate terminals of FETs P8, N8, P9, and N9 all receive the input signal shown in the form of a positive pulse 53. FETs P10 and N10 have their gate terminals connected to the output Y from inverter stage 50 at the junction between the output circuits of FETs P9 and N9. The gate terminal of FET N7 receives the output Z from inverter stage 52 at the junction of the output circuits of FETs P10 and N10. The base of transistor B2 receives the output X from inverter stage 46 at the junction between the output circuits of FETs P8 and N8. The output of circuit 44 at the junction between the emitter of transistor B2 and the source of FET N7 drives a capacitive load designated C4. As shown an additional P-channel FET P11 receiving the output Z at its gate terminal may be connected in parallel with bipolar transistor B2 between the $V_{DD}$ supply and the output to provide a full voltage swing at the output. However, FET P11 is not essential to the operation of the circuit.

Figure 9:
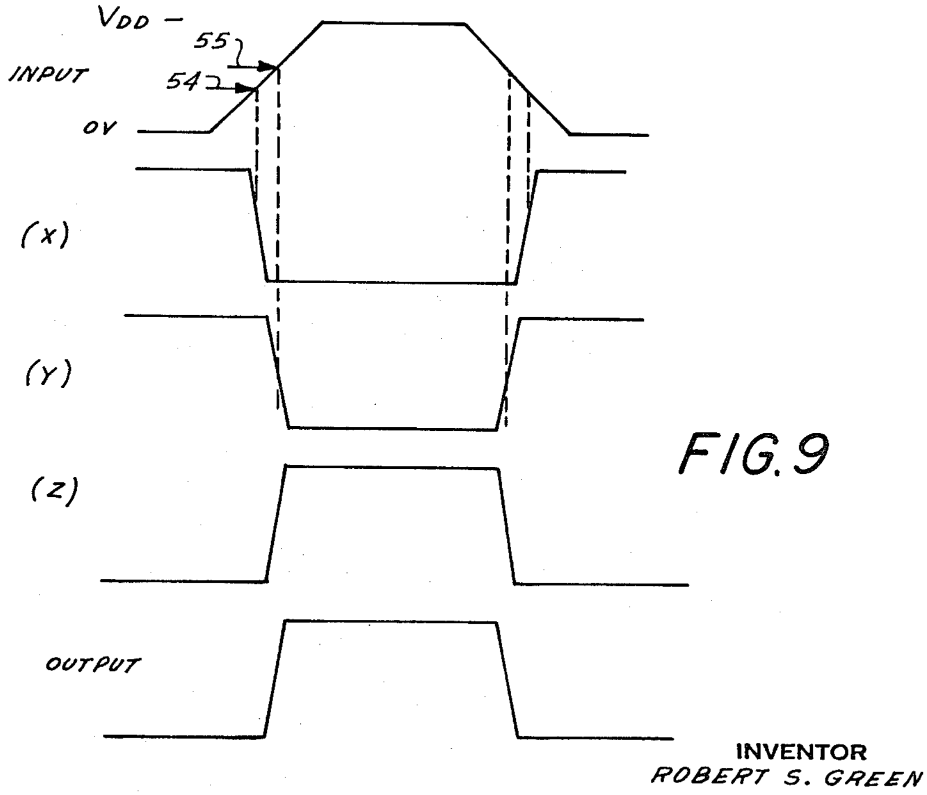
FIG. 9 illustrates the time relationship of the input and output signals and the signals generated by the three intermediate inverter stages of the circuit of FIG. 4.

The operation of the circuit of FIG. 4 will now be apparent. When the input 53 is low outputs X and Y are high and output Z is low. Accordingly, FET N7 is off (nonconductive) and transistor B2 is on (conductive) and load capacitor C4 is charged to the $V_{DD}$ level through transistor B2. When the input goes high outputs X and Y go low and output Z goes high. Transistor B2 is turned off and FET N7 is turned on to discharge C4 to ground. By making the ratio of the widths of FETs P8 and N8 relatively low and the ratio of widths of FETs P9 and N9 relatively high the transition voltage of inverter 46 may be made higher than that of inverter 50. Thus output X is slow going positive and output Y is slow going negative. The transition voltage of inverter 52 is unimportant since the rise and fall of output Z must of necessity occur within the fall and rise times respectively of output Y. Thus if output Y is slow going negative, output Z is slow going positive. This is illustrated schematically in FIG. 9. As there shown, as the input rises output X falls first, its transition voltage being indicated at 54. Output Y does not begin falling until output X has reached a level sufficient to turn off transistor B2. The transition voltage of output Y is indicated at 55. Output Z, of course, cannot begin its rise until output Y begins to fall. Thus FET N7 remains fully off until transistor B2 is turned fully off to prevent the shorting out of the power supply via transistor B2 and FET N7. While some current will flow through FET P11 during switching, this can be kept to a minimum by making this FET small since it is not the driving device. When the input goes low, first output Z goes low to turn FET N7 off and FET P11 on, after which output X goes high to turn transistor B2 on to charge load capacitor C4 positive. In practice the voltage drop across the collector-emitter terminals of transistor B2 would prevent capacitor C4 from being charged to the full supply voltage. Accordingly, FET P11 is effective to complete the swing to the $V_{DD}$ level.

Again it will be noted that the circuit of FIG. 4 is adapted to drive high capacitive loads (up to 200 pf.) without significant power dissipation. The devices of inverter stages 46, 50 and 52 are small enough to limit current and power in those stages during switching to a minimum.

It will thus be seen that the complementary circuits of both FIGS. 2 and 4 are adapted to drive extremely high capacitive loads with very little power dissipation. This is made possible by the ability to control the transition voltage of an inverter stage by varying the relative widths of the P- and N-channel devices. By utilizing inverter stages having different transition voltages between the input signal source and the complementary drive devices, the initially on device may be switched off before the initially off device is switched on to completely eliminate unnecessary current drain through both devices. As a result virtually all current goes to driving the capacitive load and the output signal rise and fall time is considerably reduced thereby increasing the switching speed of the driven circuit.

While only two of the embodiments of the present invention are here specifically described, it will be apparent that many variations may be made thereto without departing from the scope of the instant invention as defined in the following claims.

I claim:

1. A low power consumption complementary transistor circuit comprising an input node adapted to receive an input signal having a transition between first and second signal levels and an output node, signal generating means operatively connected to said input node for generating, in response to the transition of said input signal, first and second signals each having a transition between third and fourth signal levels, said transition of said first signal preceding in time said transition of said second signal, a driving stage comprising first and second semiconductor switching devices having their output circuits connected across a reference voltage source, said first and second switching devices receiving said first and second signals respectively at their control terminals and having their output circuit terminals connected to said output node, said transitions of said first and second signals, respectively, shifting said first switching device from a conductive to a nonconductive state and shifting said second switching device from a nonconductive to a conductive state.

2. The circuit of claim 1 wherein said driving stage comprises a complementary inverter, and wherein said first and second switching devices are complementary devices.

3. The circuit of claim 1, wherein said signal generating means comprises first and second complementary inverter stages having different transition voltages and adapted to generate said first and second signals, respectively.

4. The circuit of claim 1, wherein said signal generating means comprises a first complementary inverter stage adapted to generate said first signal and a double inverter comprising second and third complementary inverter stages adapted to generate said second signal, said first and second inverter stages having different transition voltages.

5. The circuit of claim 2, wherein said signal generating means comprises first and second complementary inverter stages having different transition voltages and adapted to generate said first and second signals respectively.

6. The circuit of claim 2, wherein said complementary devices are N- and P-channel field effect transistors respectively.

7. The circuit of claim 5, wherein said complementary devices are N- and P-channel field effect transistors respectively.

8. The circuit of claim 4 wherein said switching devices comprise a bipolar transistor and a field effect transistor respectively.

9. The circuit of claim 1, wherein said third and fourth signal levels are equal to said first and second signal levels, respectively.

10. The circuit of claim 8, wherein the control terminal of said field effect transistor switching device is connected to the output of said double inverter, and the base of said bipolar transistor is connected to the output of said first complementary inverter stage.

11. The circuit of claim 3, wherein said first and second complementary inverter stages each comprise a P-channel and N-channel field effect transistor connected in series across a reference voltage source, the ratio of the channel widths of said P- and N-channel field effect transistors of said first inverter stage being different than the ratio of the channel widths of said P- and N-channel field effect transistors of said second inverter stage.

12. The circuit of claim 4, wherein said first and second complementary inverter stages each comprise a P-channel and N-channel field effect transistor connected in series across a reference voltage source, the ratio of the channel widths of said P- and N-channel field effect transistors of said first inverter stage being different than the ratio of the channel widths of said P- and N-channel field effect transistors of said second inverter stage.

* * * * *

UNITED STATES PATENT OFFICE
CERTIFICATE OF CORRECTION

Patent No. 3,631,528 Dated December 28, 1971

Inventor(s) Robert S. Green

It is certified that error appears in the above-identified patent and that said Letters Patent are hereby corrected as shown below:

On the cover sheet insert -- [73] Assignee General Instrument Corporation, Newark, N. J., a corporation of Delaware -- .

Signed and sealed this 12th day of December 1972.

(SEAL)
Attest:

EDWARD M.FLETCHER,JR.
Attesting Officer

ROBERT GOTTSCHALK
Commissioner of Patents